United States Patent [19]
Liao et al.

[11] Patent Number: 6,059,585
[45] Date of Patent: May 9, 2000

[54] ELECTRIC CONNECTOR

[75] Inventors: Yen-Jang Liao, Yun-Lin Hsien; Ching-Liang Tu, Taipei Hsien, both of Taiwan

[73] Assignee: Starlink Electronics Corp., Taipei Hsien, Taiwan

[21] Appl. No.: 09/181,884

[22] Filed: Oct. 29, 1998

[51] Int. Cl.$^7$ .................................................. H01R 13/62
[52] U.S. Cl. ........................... 439/157; 439/160; 439/155
[58] Field of Search .................... 439/157, 159, 439/160, 152, 153, 154, 155, 372

[56] References Cited

U.S. PATENT DOCUMENTS

| | | | |
|---|---|---|---|
| 4,214,800 | 7/1980 | Hollyday et al. | 439/160 |
| 5,558,528 | 9/1996 | Cheng et al. | 439/160 |

*Primary Examiner*—Paula Bradley
*Assistant Examiner*—Tho D. Ta
*Attorney, Agent, or Firm*—Dougherty & Troxell

[57] ABSTRACT

An electric connector has a long insulating housing with a plurality of conducting terminals arranged within the housing. Installing seats are formed on two distal ends of the housing for mounting latch structures. Each latch structure includes a twistable head with a twistable device provided on the transverse opposite side surfaces of the twistable head, by which the user may horizontally pull the latch structure outwards in the longitudinal direction to rotate the latch from a locking position to a releasing position. The conducting terminals include a contact portion having a cambered shape, a first elastic portion integrally extending upwards from the contact portion and then downwardly, a second elastic portion integrally extending downwardly from the first elastic portion at an angle, a stopping portion integrally and vertically extending downwardly from a distal end of the second elastic portion, the width being slightly larger than that of the terminal hole on the upper edge of the housing, and a welding leg integrally extending downwardly from a distal end of the stopping portion.

17 Claims, 9 Drawing Sheets

ELECTRIC CONNECTOR

1. FIELD OF THE INVENTION

The present invention relates to an electric connector, especially to an electric connector having a latch structure and improved terminals, wherein the latch structure is used to lock or release a circuit board, such as a memory module. The terminal may form a steady electrical connection with the inserted circuit board.

2. BACKGROUND OF THE INVENTION

Figure 1:
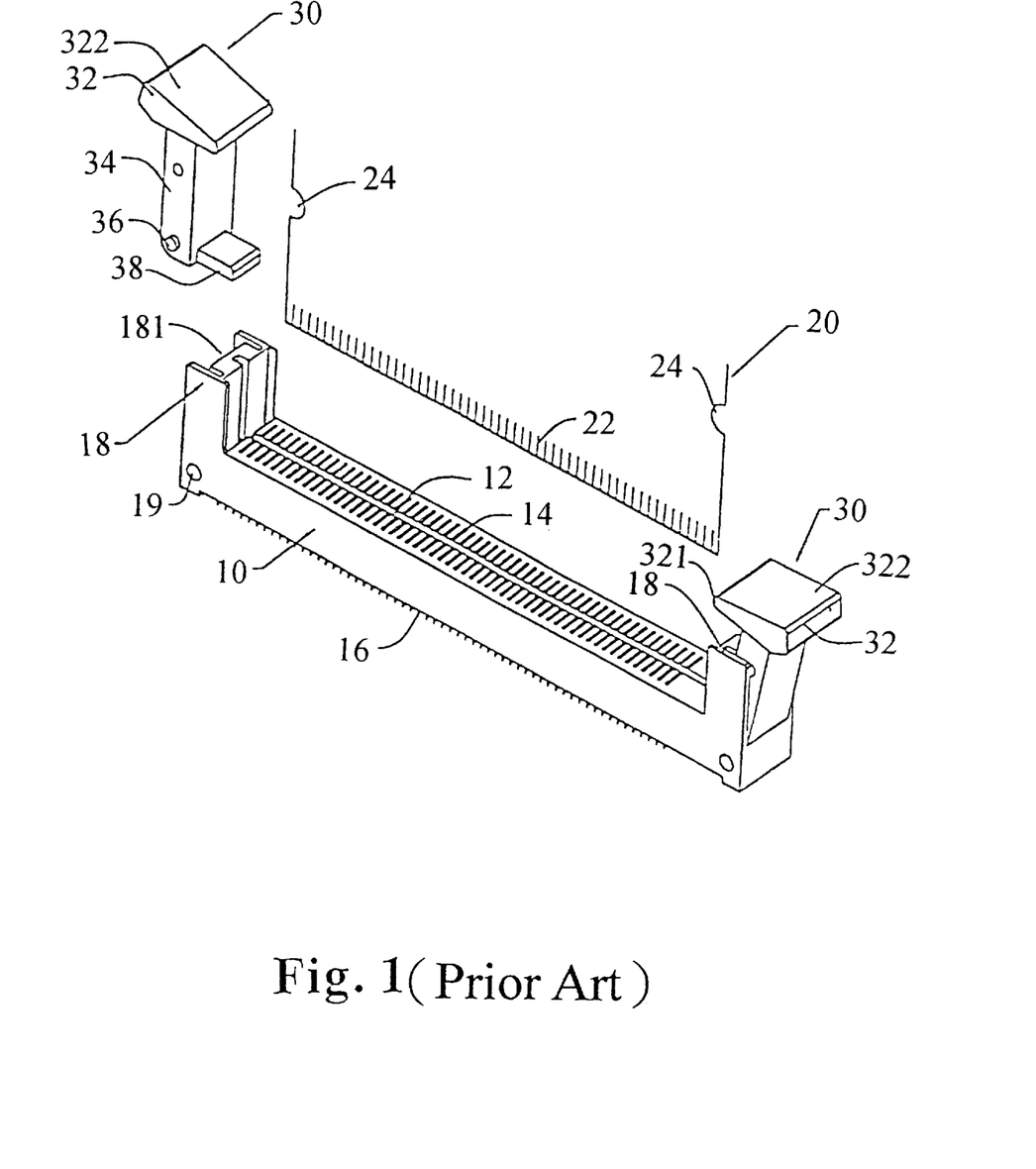
FIG. 1 is a perspective view of a prior art electric connector.

As shown in FIG. 1, a prior art electric connector is used to electrically connect a memory module and the mother board of a computer. This prior art electric connector substantially includes a long insulating housing 10, with a longitudinally extended central groove 12 arranged on the central portion of the housing 10. A plurality of paired terminal holes 14 spaced by the central groove are arranged on the two transverse opposite side walls of the housing 10 along the longitudinal length of the housing. Into each of the terminal holes 14 is inserted a terminal 16. When the edge of a circuit board 20 is inserted into the central groove 12, the terminal within the terminal hole with electrically connect with the circuit track 22 of the edge of the circuit board.

The circuit board 20 must be steadily inserted into the central groove 12 so that a steady electric connection is achieved, and the insertion and pulling of the circuit board 20 can be performed easily. Generally each of the longitudinal distal ends of the insulating housing 10 has a latch structure 30. As shown in FIG. 1, the latch structure 30 is typically installed on the installing seats 18 of the two ends of the housing 10. The latch structure 30 typically includes a head 32, a pivotal arm 34, a pivotal axial portion 36 and an ejecting arm 38. The latch structure 30 shown in the right side of FIG. 1 has been installed on the installing seat 18 and is in a releasing position, while the latch structure 30 of the left side of FIG. 1 has not been installed in the installing seat. In assembling, the latch structure 30 is pressed into an opening 181 formed on the installing seat 18 by a press-fit manner so that the pivotal axial portion 36 may be inserted into the pivotal hole 19 below the opening 181. Thus, the latch structure 30 within the opening 181 may pivotally rotate between a locking position and a releasing position.

When a circuit board 20 has been inserted into the central groove 12, the lower portion of the edge of the circuit board will push against the ejecting arm 38 of the latch structure 30, thus the latch structure 30 will rotate inwards in to the locking position. In the locking position, the forward projected buckling portion 321 of the head 32 of the latch structure 30 will buckle with the concave mouth 24 on the side of the circuit board 20. Thereby, the circuit board may be steadily fixed in the groove of the connector. When the circuit board is required to be released from the central groove 12, as shown in FIG. 1, the thumb will press downwards the upper surface 322 of the head 32. Then a downward horizontal force will cause the latch structure 30 to rotate outwards to a releasing position. During rotating, the ejecting arm 38 will eject the circuit board upwards. The prior art electric connector may refer to U.S. Pat. Nos. 5,470,240, 5,211,568, 5,389,000, 5,074,800, 5,302,133, and 4,973,255, and Taiwan Patent Nos. 84200526,83213346, 84218006,85215054, and 84212006.

In practice, the above prior art latch structure 30 of an electric connector has many problems. At first, when an unskilled user requires to release this circuit board, he (or she) must use a relatively large force to press downwards on the upper surface 322 of the head 32. Then this downward rotation force causes the head to rotate outwards in the longitudinal direction (now the circuit board is still located in the central groove 12, and the terminal 16 still retains a relative holding force). However, once the circuit board has been ejected upwards to be released from the holding force (i.e. the latch structure attains a releasing position), the downward rotation force generally can not be stopped in time and still presses downwards. Therefore, the pivotal axial portion 34 will break near the pivotal axial portion 36.

Next, the prior art "pressed rotation" type latch structure needs much force in operation, since most of the user's force is applied downwards, only a small horizontal component of the force is used to effectively rotate the latch structure. Besides, since the usable space in the mother board of current computers is more and more compact, such kind of "pressed rotation" type latch structure is inconvenient in operation in some environments. Moreover, effective protection has not bee provided in a breakable portion of a prior art latch structure (the portion adjacent to the pivotally axial portion), thus, such kind of "pressed rotation" type latch structure often breaks in use.

Figure 7:
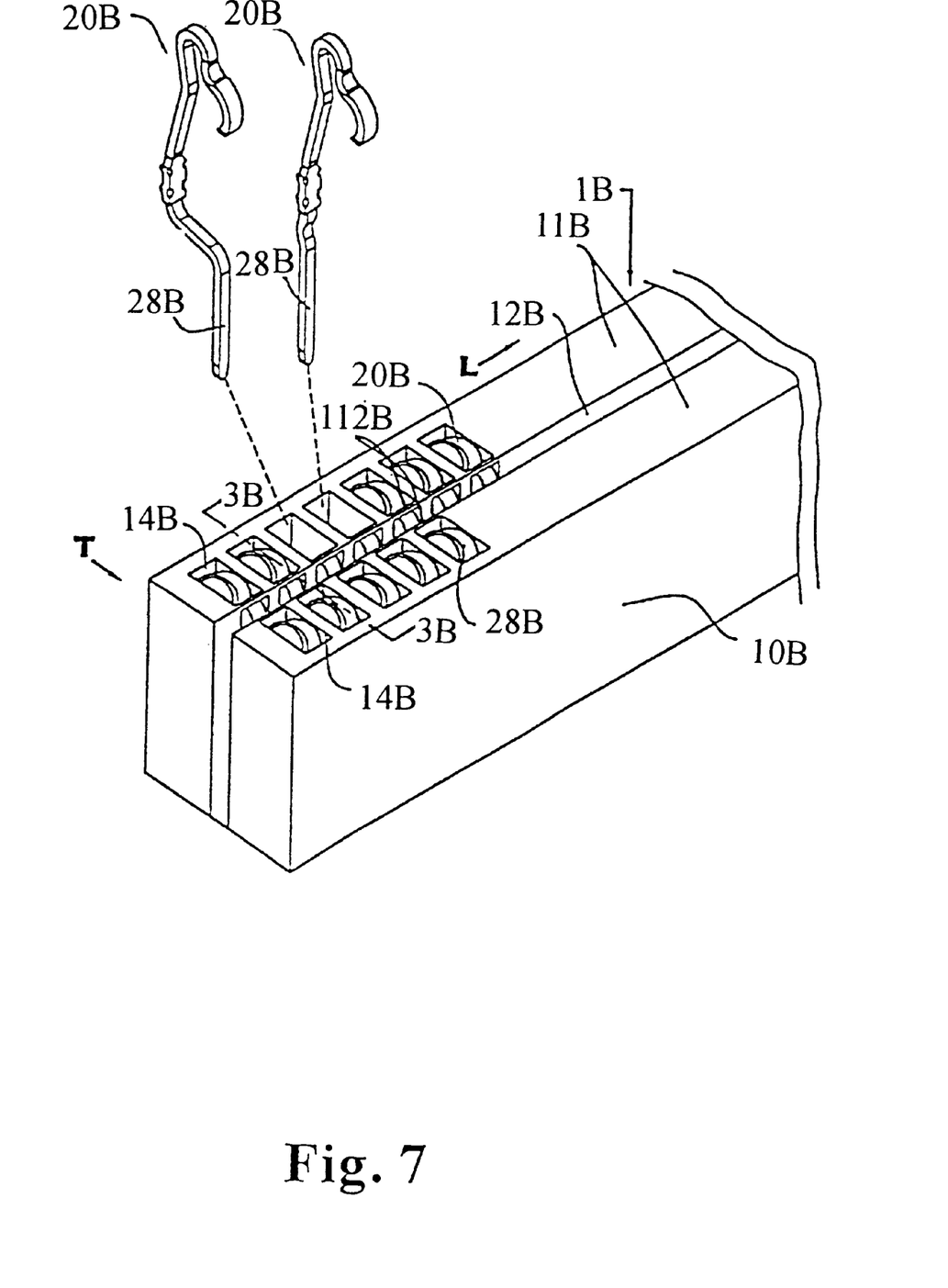
FIG. 7 is a partial perspective view of the electric connector according to the present invention, in which two alternatively arranged terminals are shown.

Furthermore, as shown in FIG. 7, an electric connector for electrically connecting a circuit board (such as RAM modular) and the mother board of a computer is shown. This kind of electric connector typically includes a long insulating housing 10B the central portion of which has a longitudinally extending central groove 12B. A plurality of paired terminal holes 14B spaced by the central groove 12B are arranged on the two transverse opposite side walls 10B of the housing 10B along the longitudinal length of the housing 10B (as shown in the direction indicated by the arrow L of FIG. 7). Into each of the terminal holes 14B is inserted a terminal 20B. When the edge of a circuit board (not shown) is inserted into the central groove 12B, the terminals 20B within the terminal holes will electrically connect with the circuit track on the edge of the circuit board.

Figure 10A:
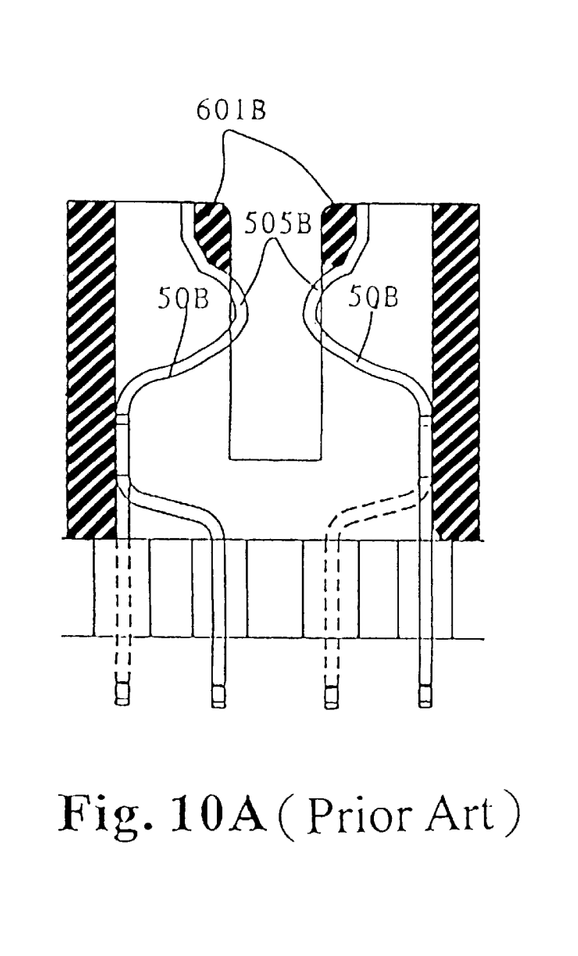
FIG. 10A is a cross sectional view of a prior art electric connector, in which a terminal is installed within the terminal hole.

Generally, this kind of electric connector has two types of terminals (i.e. the first terminal 20B and the second terminal 20'B according to the present invention as shown in FIG. 7, or the first terminal 50B and the second terminal 50'B according to the prior art as shown in FIG. 10A). In general, these two types of terminals are alternatively arranged in and inserted into the terminal holes (for example, the odd number holes are used by first terminals, while the even number holes are used by second terminals). The terminal holes with respect to the opposite two side walls 11B are inserted by first and second terminals, respectively (for example, if the first terminal hole of one side wall is inserted by a first terminal, then the first terminal hole of another side is inserted by a second terminal).

Figure 10B:
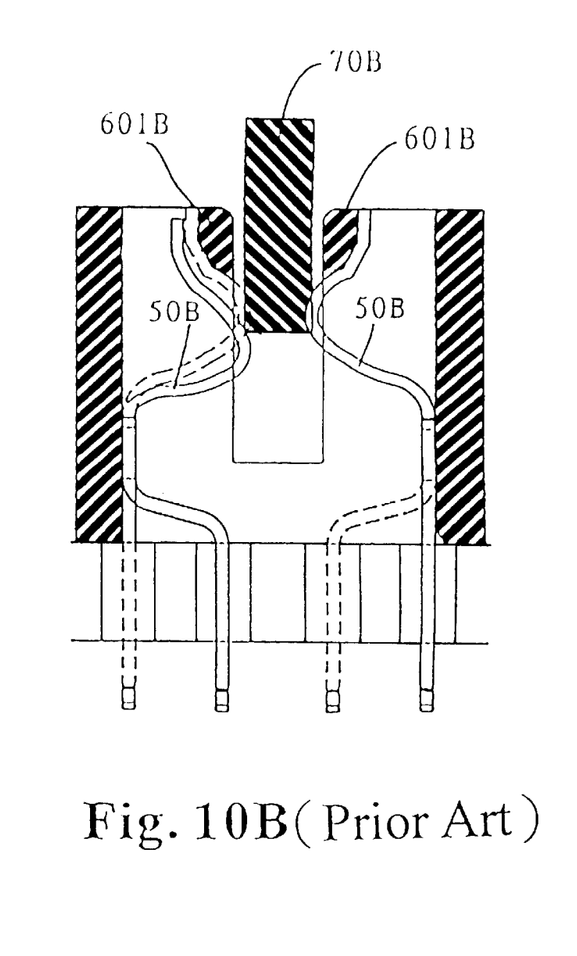
FIG. 10B is a cross sectional view of an electric connector during using, in which a buckled electric connector is shown as it is inserted into the circuit board.

Referring to FIGS. 10A and 10B, a prior art terminal structure of this kind of electric connector is shown. As shown in the figure, in order that the circuit board inserted by the terminals 50B, 50'B may attain a steady electric connection, an elastic contact portion 505B having a bent shape is designed in the terminals so that a constant contact force is formed between the terminal and the circuit board, and to prevent the terminal from being obliquely inserted into the terminal hole to cause an unsteady contact between the terminal and the circuit board. In this general design, the terminal is held in the terminal hole by a pre-stress. For example, in FIG. 10A, the distal end of the curved elastic contact portion 505B presses against the rib 601B above the insulating housing by a pre-stress. In the following description and claims, the word "pre-stress" means that when the terminal is inserted in a terminal hole, a stress is applied on the terminal, and in general, the stress is provided by the elasticity of the terminal itself.

Although, the prior art terminal may have a steady electrical connection with a circuit board, in practical use, it has some potential defects. As shown in FIG. 10B, when the edge of the circuit board 70B is inserted into the central groove of a connector, the edge may press downwards the elastic contact portion of the terminal 50B directly so that the terminal will be buckled. Once one of a plurality (for example, 168) of terminals of the electric connector is buckled, then the whole electric connector will not work.

Moreover, since the prior art electric connector has not provided any device for tightly fixing the terminal within the terminal hole, the electric connector very probable will be buckled due to the shift of the terminal.

SUMMARY OF THE INVENTION

Accordingly, the object of the present invention is to provide an elastic connector with a "twist" latch structure, by which a circuit board may be released easily and conveniently.

Another object of the present invention is to provide an electric connector with a latch structure, wherein a force buffer device may be used to prevent the latch structure from breaking during releasing of the circuit board.

A further object of the present invention is to provide a latch structure used in an electric connector having a convenient and safe enhancing structure. Thus, in use, the latch structure will not break.

A still further object of the present invention is to provide an electric connector with an improved terminal, wherein by the design of the terminal, the concave portion will not be applied by an pre-stress under installation condition. A pre-stress is provided by a first elastic portion and a second elastic portion for fixing the terminal. Therefore, not only can it steadily electrically connect with the inserted circuit board, but also the terminal may be tightly fixed with a terminal hole. Thus, the reliability of the electric connector is greatly improved.

In the present invention, the term "pressed rotation" means during releasing a circuit board from an electric connector, the user applies a force on the releasing device which is at first pressed downwards and then is rotated outwards in the longitudinal direction by the horizontal component of the pressing force. Another, the term "twist" in the present invention means during releasing a circuit board from an electric connector, the user applies a force on the releasing device which is pulled by a substantially horizontal force so that the releasing device is rotated outwards in a longitudinal direction. Further, the term "longitudinal direction" used in the claim of the present invention means a direction from one end substantially parallel to the insulating housing of electric connector to a central groove in another end. While the term "transverse direction" used in the present invention means a direction substantially perpendicular to the "longitudinal direction". The terms "inwards" and "outwards" used in the present invention mean directions toward and away from the central groove, respectively.

Therefore, one characteristic of the present invention is to provide a latch structure used in an electric connector, wherein the electric connector comprises a long insulating housing and a plurality of conducting terminals arranged within the housing. The housing has a longitudinally extending central groove. Near the two opposite distal ends of the housing are installed respective latch structure installing seats which are each formed by a pair of transversely and inwards extending stopping blocks and installing seat walls longitudinally extending outwards from the installing seats, with an installing hole formed therein. The installing seat wall is formed by at least two walls with different widths and at least one stepping portion is formed between the two walls of different widths. The latch structure within the installing hole of the installing seat may be longitudinally rotated outwardly and inwardly between a locking position and a releasing position of the circuit board. The latch structure includes a twistable head having a top surface and two opposite side surfaces. The top surface is longitudinally and inwardly extended with a locking portion which may engage the edge of the circuit board. The transversely opposite side surfaces are provided with a twistable device, by which the latch structure can be longitudinally and outwardly pulled so to horizontally rotate from a locked position to a releasing position; a pivotal arm integrally and downwardly extending from the twistable head, wherein a force buffering device is provided on the two transversely opposite side walls of the pivotal arm. Thereby, the force buffering device, as the latch structure longitudinally and outwardly rotates from a locking position to a releasing position, the applying force of the user will be buffered so that the latch structure is protected by a two stage buffer; a pivotal axial portion below the pivotal arm and extending outwards from the two transversely opposite side surfaces; and an eject arm integrally extending inwardly in the longitudinal direction from the distal end of the pivotal arm.

Another characteristic of the improved electric connector in the present invention is that the electric connector comprises a long insulating housing, the central portion of which has a longitudinally extending central groove. A plurality of paired terminal holes spaced by the central groove are arranged on the two transversely opposite side walls of the housing along the longitudinal length of the housing. Into each of the terminal holes is inserted a terminal 20B with a contact portion having a cambered shape. The terminal includes: a first elastic portion integrally extending upwards from the contact portion and then reversely bent downwards with an angle; a second elastic portion integrally extending downwards from the first elastic portion with an angle; a stopping portion integrally and vertically extending downwards from the distal end of the second elastic portion, the width thereof being slightly larger than that of the terminal hole on the upper edge of the housing; and a welding leg integrally extending downwards from the distal end of the stopping portion. When the terminal is inserted in the terminal hole, the front edge of the first elastic portion thereof resists against the stopping block above the housing, then a pre-stress is provided by the elastic force of the first elastic portion and the second elastic portion, while the free end of the contact portion does not resist against any walls within the terminal hole. Therefore, when it is contacted with a circuit board, a fixed contact force may be provided. Moreover, since the free end of the contact portion does not resist against with any portion of the housing, when a circuit board is inserted, the terminal will not be buckled.

In the stopping portion of the terminal of the electric connector in the present invention, four tip portions are formed on the surface facing the inner wall of the housing by punching, and the four tip portions are uniformly distributed on the surface. Thereby, when the terminal has been inserted into a terminal hole, since the four tip portions will prick into the wall of the housing of the electric connector, the terminal will not shift in any direction. Since the four tip portions are uniformly distributed on the surface of the stopping portion, an uniform holding force is obtained and thereby the terminal will not shake in any direction.

The welding leg of the terminal of the electric connector in the present invention is directly downwards and vertically extending from the distal end of the stopping portion, and a concave portion is formed on the distal end of the stopping portion by punching. The function of this concave portion is to prevent the flow of tin into the terminal holes through the lower portion of the mother board along the welding leg by a siphon effect when the electric connector is welded.

Further, in the terminal of the electric connector in the present invention, the free end of the contact portion is inserted into the terminal hole. This design will prevent shifting of the contact position during invention of a circuit board.

The present invention will be better understood and its numerous objects and advantages will become apparent to those skilled in the art by referring to the following drawings:

DETAILED DESCRIPTION OF THE PREFERRED EMBODIMENT

Figure 2:
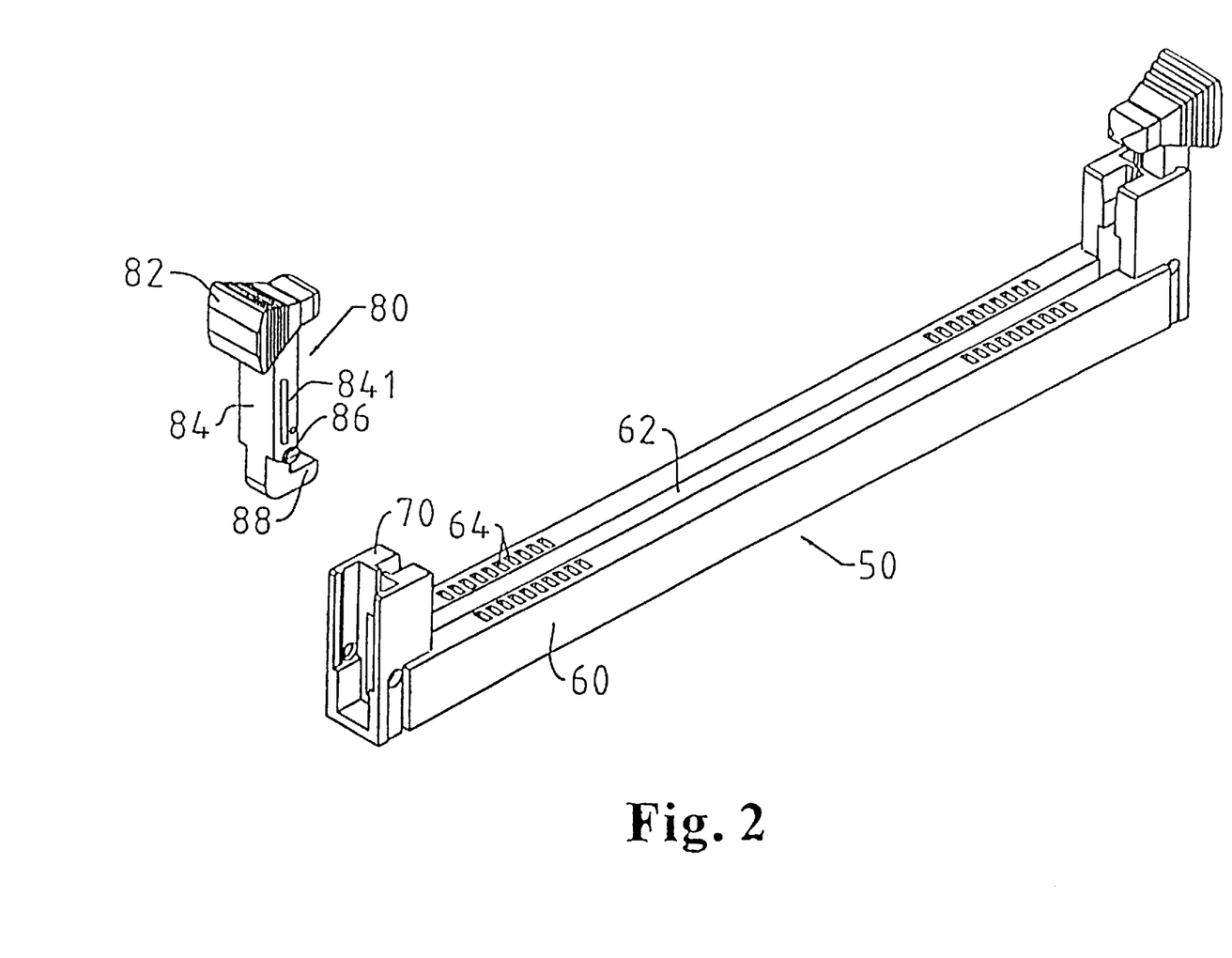
FIG. 2 is a perspective view of the electric connector in the embodiment of the present invention.

Now referring to FIG. 2, the electric connector 50 of the preferred embodiment of the present invention is shown. As shown in FIG. 2, the electric connector 50 typically comprises a long insulating housing 60 the central portion of which has a longitudinally extending central groove 62. A plurality of paired terminal holes 64 spaced by the central groove 62 are arranged on the two transverse opposite sides walls of the housing 60 along the longitudinal length of the housing 60. In each of the terminal holes 64 is inserted a terminal (not shown). When the edge of a circuit board (not shown) is inserted into the central groove 62, the terminals within the terminal holes will electrically connect with the circuit track on the edge of the circuit board.

The two opposite distal ends of the insulating housing 60 having respective installing seats 70 for latch structure 80. Since the latch structures 80 on the two respective ends of the housing have the same structure, thus in the following, only on latch structure is described. As is clearly shown in FIG. 2, the latch structure 80 typically includes a twistable head 82, a long pivotal arm 84 integrally and downwardly extending from the twistable head or head section 82, and pivotal axial portions 86 extending outwards from the two side walls 841 of the pivotal arm 84 which are transversely opposite each other and are slightly higher than the distal end of the pivotal arm 84. An ejecting arm 88 longitudinally and inwardly extends integrally from the distal end of the pivotal arm 84.

Figure 3A:
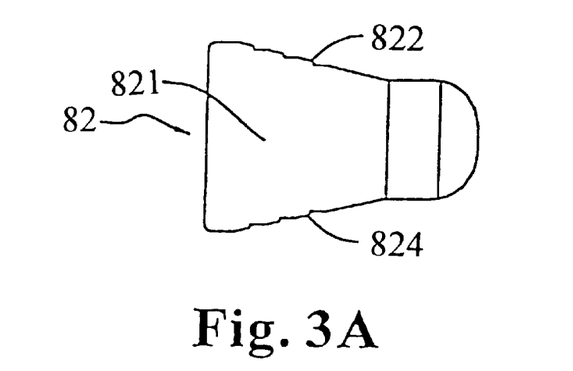
FIG. 3A is a plane view of the twistable head of the latch structure according to the present invention.
Figure 3B:
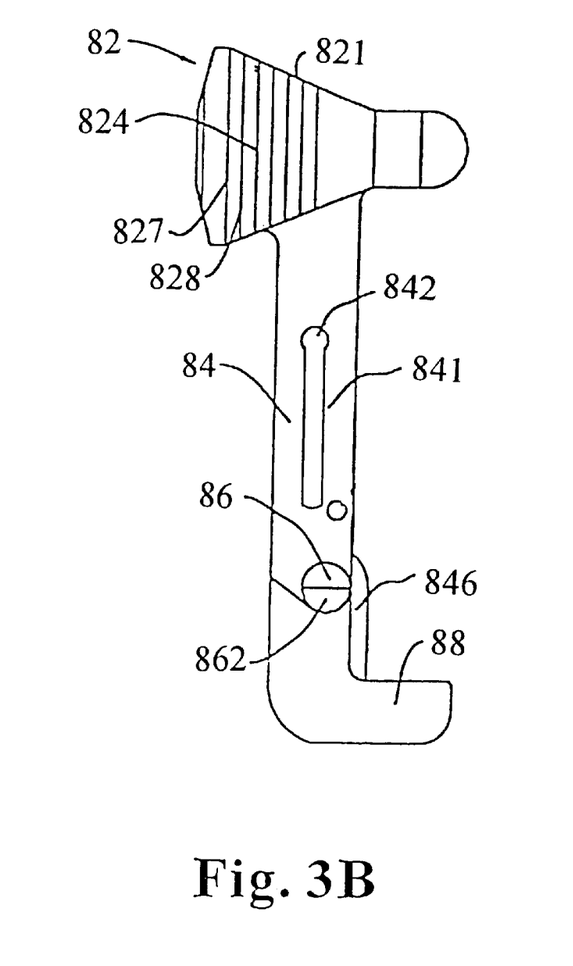
FIG. 3B is a side view of the latch structure in the present invention.

As shown in FIGS. 3A and 3B, the upper surface of the twistable head 82 has a tapered surface 821 from an upper portion to a lower portion. The rotational devices of the present invention are installed on the two opposite side surfaces 822 and 824. In this embodiment, the twistable device is formed by inwardly inclined surfaces. Therefore, the twistable had 82 of the present invention substantially has a tapered shape and the top portion may be buckled with the locking portion of a concave mouth (not shown) on the side of a circuit board. As shown in FIG. 3B, alternatively arranged ridge portions and concave portions 827 and 828 are formed on side surfaces 822 and 824 by which the fingers of the user may hold the side surfaces 822 and 824 more steadily so as to horizontally pull the twistable devices outwards. As shown in FIG. 3B, a rib 842 is formed above the pivotal shafted portion 86 on the two opposite walls 841 of the pivotal arm 84 for forming the force buffering device of the present invention. The structure and function thereof will be further described with the installing hole 78 of the insulating housing 60.

In this embodiment, the twistable device has lateral tapered surfaces 822 and 824 of the twistable head 82 opposite with each other in the transverse direction with alternatively arranged ridge portions and concave portions 827 and 828. However, the present invention is not to be limited by this embodiment. For example, concave curved surfaces opposite with each other in the transverse direction may also be formed on the tapered side surfaces of the twistable head 82 as a substitute for the inclined surfaces 822 and 824. Transversely and outwardly extending vertical pieces extending from transverse sides of the twistable head can also be used to substitute the inclined surfaces 822 and 824. Such kinds of horizontal pull-able structures formed by two transverse side surfaces of the twistable head are within the spirit and scope of the present invention.

Figure 4:
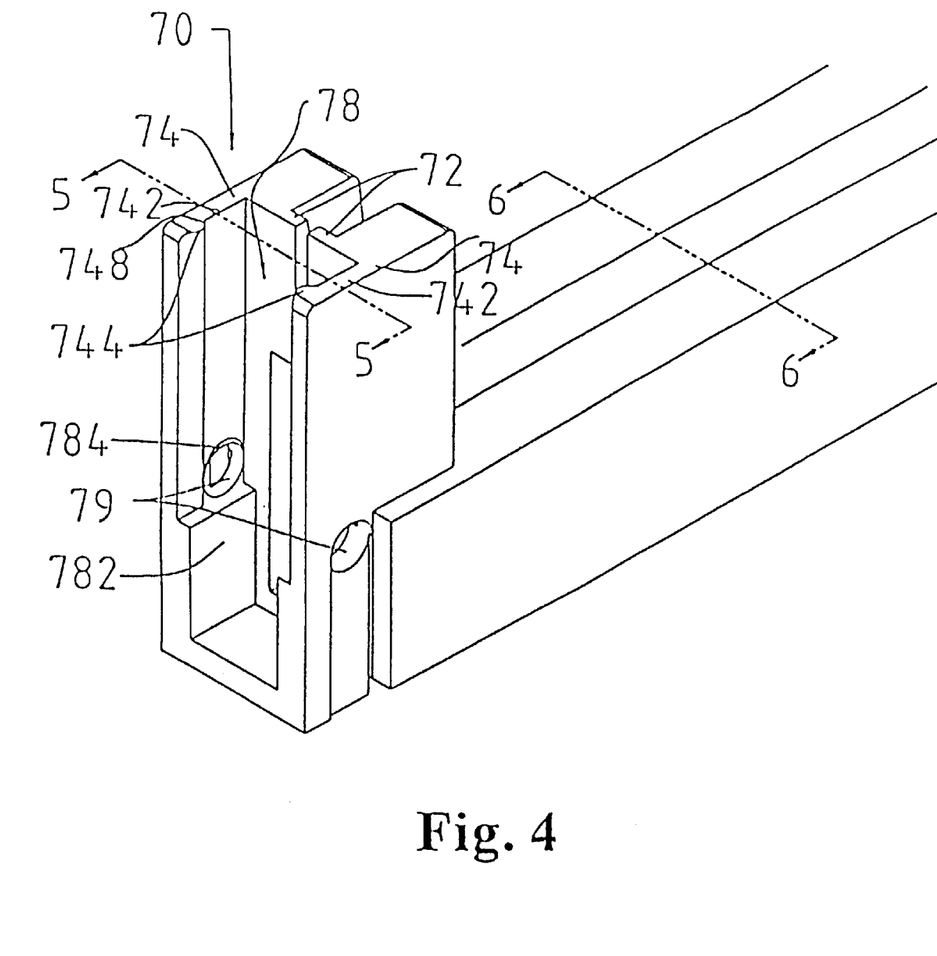
FIG. 4 is a perspective view of the installing seat and installing holes of a latch structure according to the present invention.
Figure 5:
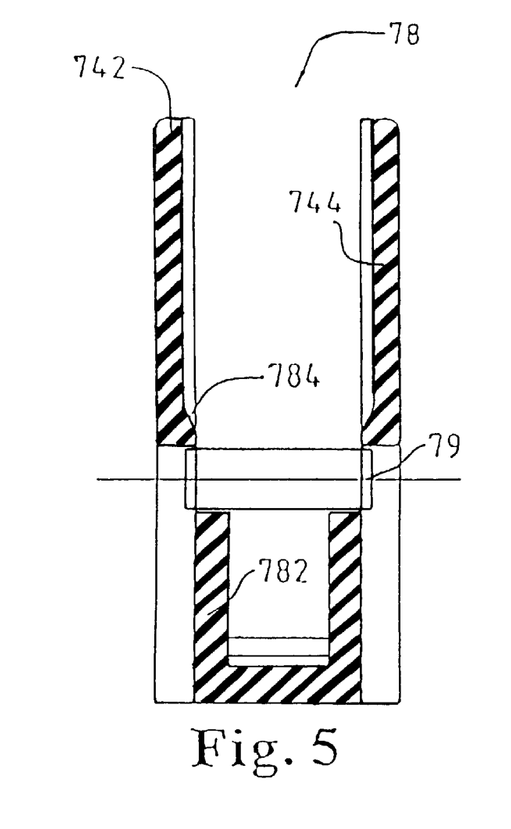
FIG. 5 is a cross sectional view taken along line 5—5 of FIG. 4.
Figure 6:
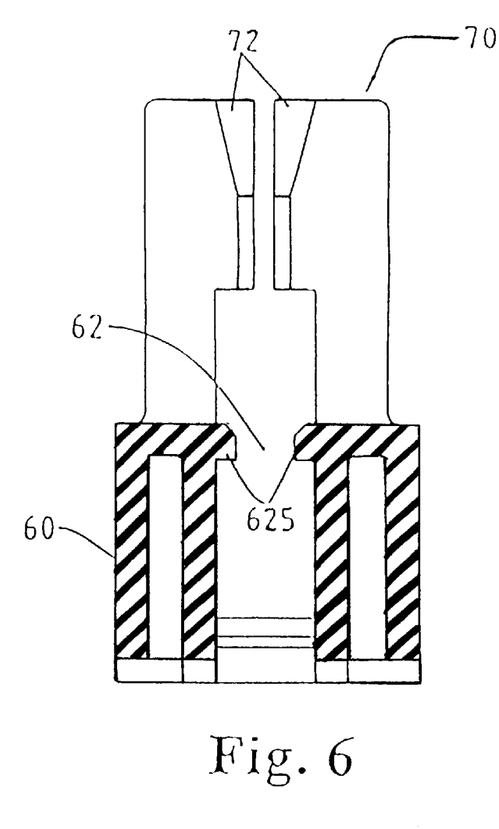
FIG. 6 is a cross sectional view taken along line 6—6 of FIG. 4.

FIGS. 4, 5, and 6, show the installing seat 70 of the latch structure 80 in the embodiment of the present invention. Since in the insulating housing 60 of the electric connector, the two opposite sides of the central groove 62 are symmetric, the following description only describes one side thereof. At first, referring to FIGS. 4 and 5, the installing seat 70 is formed by a pair of transversely and inwardly extending stopping blocks 72 and two longitudinally and outwardly extending installing seat walls 74, with an installing hole 78 formed therein. When the latch structure 80 is in a locked position, the stopping piece will cause the side wall facing central groove 62 of the pivotal arm 84 resists against the stopping block so that the latch structure 80 may be fixed in a locking position. The longitudinally and outwardly extended installing seat walls 74 are each formed with a then wall portion 742 and a thick wall portion 744 so that grooves are formed between the thin wall portions 742 and the thick wall portions 744. A stepping portion 748 is formed between the thin wall portion 742 and the thick wall portion 744, while the installing seat 74 is formed with a cambered surface the thickness of which is reduced gradually, as shown in FIG. 4.

Two round flanges 842 and on the two transversely opposite side walls 841 of the pivotal arm 84 are formed with a channel matched with the thin wall portions 742 within the installing seat 70 so as to form the force buffering or regulating device of the present invention. The action thereof will be described in the following.

The position of the rib 842 on the pivotal arm 84 is matched with the rotation of the latch structure 80 in positions of locking and releasing so then when the latch structure 80 is in a locking position, the rib 842 is buckled with the stepping portion 748 in the installing hole 78. Other than positioning the latch structure 80, if the user wants to release the circuit board, the initial force for pulling the twistable head 82 will be buffered. Once the circuit board is released, this design can prevent a larger force still being applied on the latch structure 80 to prevent the pivotal arm 84 from being broken. Therefore, the force buffering device of the present invention is a two stage buffer to the applied force as the latch structure 80 rotates from a locking position to a releasing position. The applied force of the user is achieved in two stages. Therefore, the pivotal arm may be prevented from breaking by a sudden large force.

As shown in FIG. 4, the pivotal holes 79 are arranged below the thin wall portion 742 for receiving the pivotal axial portions 86 of the latch structure 80 so that the latch structure 80 may rotate around the pivotal axial portions 86. The wall portions of the thin wall portion 742 and the thick wall portion 744 on the elevation about the pivotal hole 79 are transversely and inwardly projecting so as to form a thicker lower thick wall portion 782. An inclined surface 784 is formed between the lower thick wall portion 782 and the pivotal hole 79. The function of this inclined surface 784 is such that when the latch structure 80 is put into the installing hole 78, it will match with the sloping surface 862 (referring to FIG. 3B) below the pivotal axial portion 86 of the latch structure 80. Thus, during installation, the latch structure 80 may be easily fitted into the installing hole 78. Moreover, when the latch structure 80 rotates from a releasing position to a locking position, the cambered surface with a gradually reduced surface formed by the thick wall portion 744 will cause the rib 842 on the pivotal arm 84 to slide into the channel formed by the thin wall portion 742.

Next, as shown in FIG. 6, in the central groove 62 near the installing seat 70, a stopping block 625 transversely and inwardly extends from the two side walls of the central groove 62. The function of this stopping block 625 is that after the latch structure 80 has rotated to a proper position, the distal end of the latch structure 80 can resist against the stopping block 625 to prevent the latch structure 80 from rotating outwards. Referring to FIG. 3B, an enhancing rib 846 is formed on the side wall of the pivotal arm 84 facing the central groove 62, the range thereof is substantially from the high portion of the pivotal axial portion 86 to the upper surface of the ejecting arm 88. The function of the enhancing rib 846 is to enhance a portion of the pivotal arm 84 which is easily broken by an overlarge force (i.e. the place near the pivotal axial portion 86).

Referring now to FIG. 7, the electric connector 1B typically comprises a long insulating housing 10B the central portion of which has a longitudinally extending central groove 12B. A plurality of paired terminal holes 14B spaced apart by the central groove 12B are arranged on the two transversely opposite side walls 11B of the housing 10B along the longitudinal length of the housing 10B (as shown in the direction indicated by the arrow L of FIG. 7). Into each of the terminal holes 14B is inserted terminals 20B, 20'B. When the edge of a circuit board (not shown) is inserted into the central groove 12B, the terminals 20B, 20'B within the terminal hole will electrically connect with the circuit track on the edge of the circuit board. As can be appreciated from the figure, the electric connector 1B has two types of terminals, i.e. the first terminal 20B and the second terminal 20'B. These two types of terminals are alternatively arranged in and inserted into the terminal holes. Moreover, the two types of terminals of the present invention are only different in the shape of the welding legs 28B, 28'B.

Figure 8A:
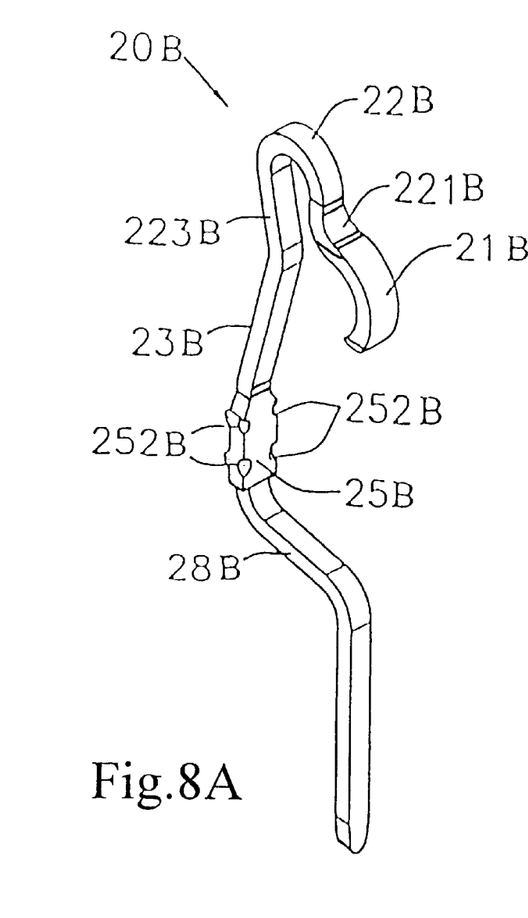
FIG. 8A is a perspective view of a first terminal of the present invention.
Figure 8B:
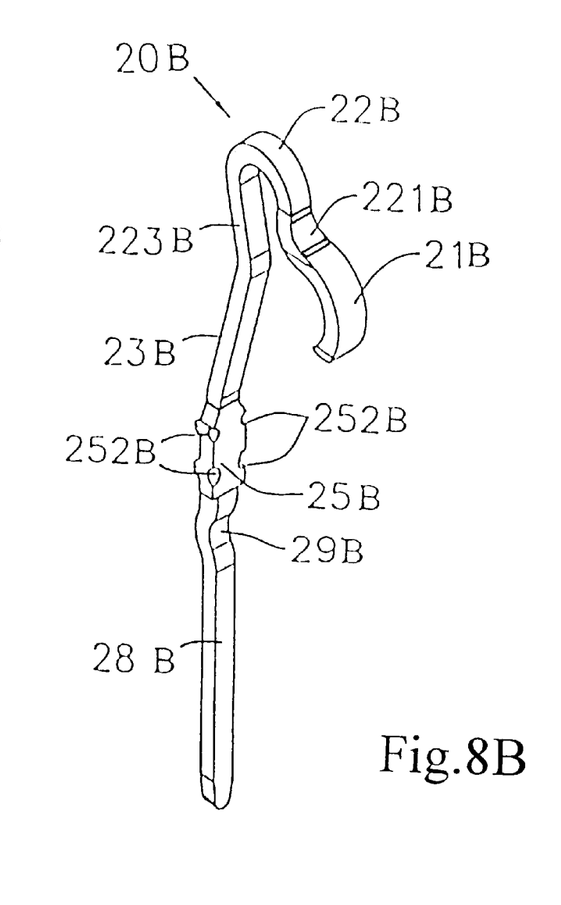
FIG. 8B is a perspective view of a second terminal of the present invention.

Now referring to FIGS. 8A and 8B, it can be appreciated that the terminals 20B, 20'B have a cambered contact portion 21B. A first elastic portion 22B integrally extends upwardly from the contact portion 21B and then downwardly with an angle, and a second elastic portion 23B integrally extends downwardly from the second elastic portion 22B at an angle. Thus the rear edge 223B of the second elastic portion 22B at an angle. Thus the rear edge 223B of the second elastic portion 22B and the second elastic portion 23B are formed as a ">" shape. Next, the stopping portion 25B vertically and downwardly extends from the distal end of the second elastic portion 23B. The welding leg 28B of the first terminal 20B substantially transversely and horizontally extends through a length from the distal end of the stopping portion 28'B of the second terminal 20'B substantially vertically and downwardly extends from the distal end of the stopping portion 25B. A concave portion 29B is formed near the stopping portion 25B, the function thereof will be described in the following.

The width of the stopping portions 25B of the terminals 20B, 20'B are wider than that of the other portions of the terminals so that when the terminals 20B, 20'B are inserted into the terminal holes 14B, the width of the terminal holes 14B is wider than that of the other portions of the terminals. Thus the terminals 20B, 20'B may be tightly fixed with the terminal holes 14B by tight engagement. Thus the terminals 20B, 20'B will not be shifted in the longitudinal direction. In order to prevent the terminals 20B, 20'B within the terminal holes 14B from shifting shifted in the transverse direction (as the direction indicated by the arrow T in FIG. 7), four tip portions 252B are formed on the surface of the stopping portion 25B by punching. They are uniformly distributed on the surface of the stopping portion 25B so that when the stopping portion 25B is resisted against the inner surface of the side wall 11B of the housing 10B, the tip portions 252B may prick into the side wall 11B. Thus, the terminals 20B, 20B may be steadily fixed on the terminal holes 14B.

Figure 9:
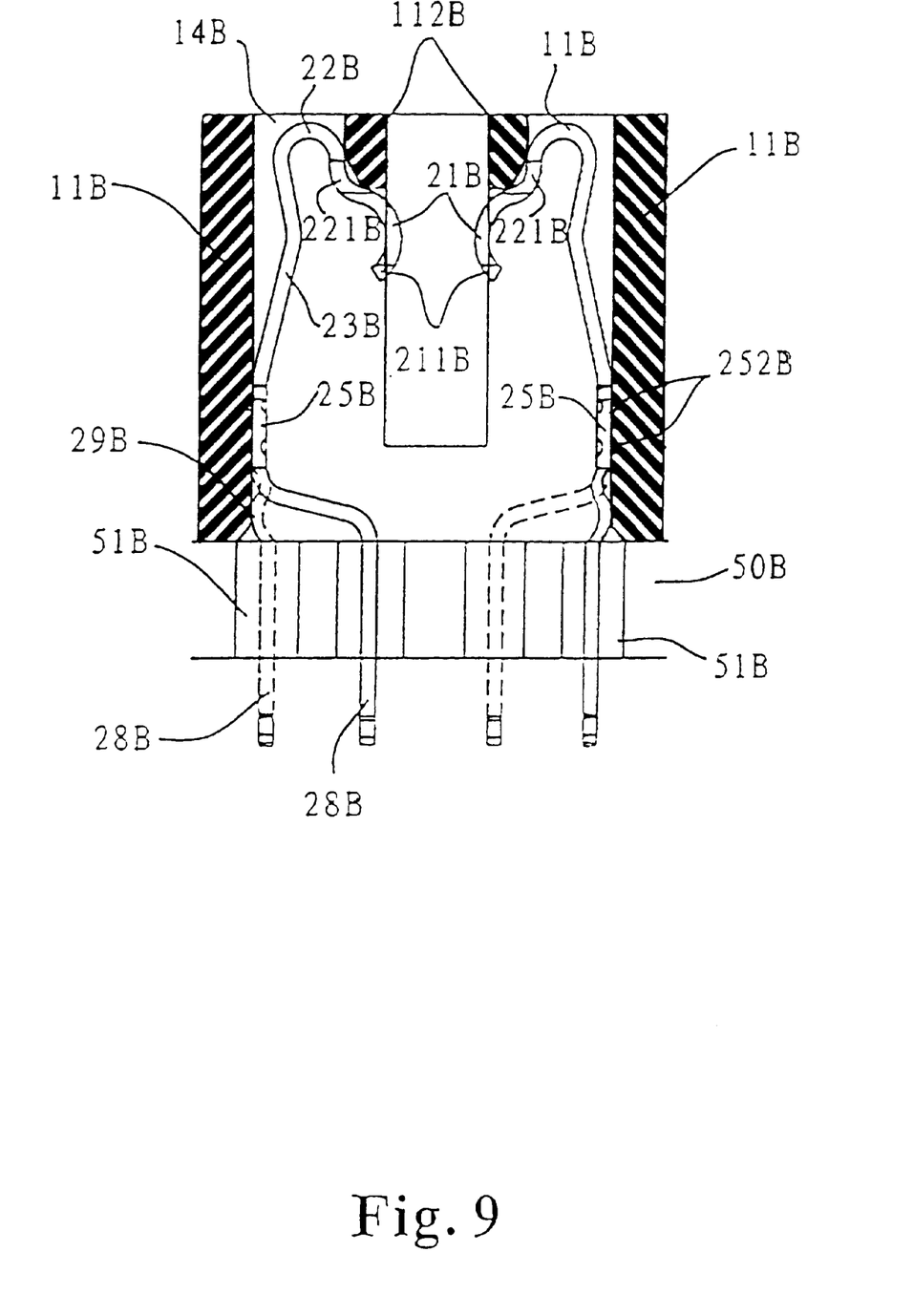
FIG. 9 is a cross sectional view along line 3B—3B of FIG. 7.

Referring to FIG. 9, the front edges 221B of the first elastic portion 22B of the terminals 20B, 20'B are resisted against the stopping ribs 112B above the side walls 11B of the housing. Note, under the common action of the elastic forces of the first elastic portion 22B and the second elastic portion 23B, the terminals 20B, 20'B are tightly fixed within the terminal holes 14B by a pre-stress for fixing the terminals is provided by the elastic forces of the first elastic portion 22B and the second elastic portion 23B regardless of the contact portions 21B of the terminals 20B, 20'B. Therefore, when a circuit board is inserted into the electric connector 1B of the present invention the contact force between the contact portions 21B of the terminals 20B, 20'B and the edge of the circuit board may be maintain at a fixed value. Moreover, since the contact portions 21B of the terminals 20B, 20'B need not suffer pre-stress, the free ends 211B of the contact portions 21B will not resist against any portion of the housing wall. Thus, no matter how large the bending angle of the contact portion 21B, it will not be bent as the circuit board is inserted into the connector.

As shown in FIG. 9, the free ends 211B of the terminals 20B, 20'B extend into the inner portion of the terminal hole 14B. This is advantageous when the terminals 20B, 20'B contact the circuit board, thereby, the free ends 211B of the contact portions 21B will not shift so as to separate from the terminal holes 14B. As described above, the concave portion 29B formed above the welding leg 28'B of the second terminal 20B of the present invention is near the stopping portion 25B. This concave portion 29B prevents tin from flowing into the terminal holes 14B through the lower portion of the mother board 50B along the welding legs 50B by a siphon effect when the electric connector is welded in a tin furnace.

Accordingly, by the special design of the terminals of an electric connector in the present invention, when the electric connector is connected with a circuit board, a fixed contact force between the terminals and the circuit board is asserted, and the terminals will not be buckled. Moreover, since the terminals of an electric connector of the present invention has provided an effective holding device, the terminal within the terminal hole will not shift in any direction. Therefore, a reliability of the electrical connection between the terminal sand the circuit board is improved.

Although a certain preferred embodiment of the present invention has been shown and described in detail, it should be understood that various changes and modification may be made therein without departing from the scope of the appended claims.

What is claimed is:

1. An electrical connector for receiving a circuit board, comprising:

an elongated insulative housing having a central groove extending in a longitudinal direction for receiving an edge of the circuit board, a pair of installing seats are provided at two opposite ends of the housing;

a plurality of conducting terminals arranged within a plurality of terminal holes on two transversely opposite side walls of the housing, when the edge of the circuit board is inserted into the central groove, the terminal within the terminal hole will electrically connect with a circuit track of the edge of the circuit board; and a latch structure installed with each of the installing seats of the housing, the latch structures can inwardly and outwardly rotate between a position for fixedly locking the circuit board and a position for releasing the circuit board, each latch structure including a head section, a pivotal arm integrally extending downwards from the head section, a pivotal portion extending in an axial direction normal to the longitudinal direction and located under the pivotal arm and an ejecting arm extending inwardly in the longitudinal direction from a distal end of the pivotal arm, wherein an actuation section is provided on the head section, by this actuation section, the user may horizontally and outwardly pull the latch structure to rotate about the axial direction from a fixedly locking position to a releasing position, the actuation section of the head section is formed by gradually and inwardly tapered surfaces on two transversely opposite sides of the head section, and each surface formed an inclined angle with respect to the longitudinal direction.

2. The electrical connector as recited in claim 1, wherein the gradually and inwardly tapered surfaces on the two transversely opposite sides of the head section have alternatively arranged ridge portions and valley portions.

3. The electrical connector as recited in claim 1, wherein the head section has transverse concave surfaces on the two transversely opposite sides thereof.

4. The electrical connector as recited in claim 1, wherein the pivotal arm of the latch structure has an enhanced rib extending from a wall facing the central groove, the enhanced rib extending substantially between the pivotal axial portion and an upper surface of the ejecting arm.

5. The electrical connector as recited in claim 1, wherein each installing seat comprises a pair of transversely and inwardly extending stopping blocks and two longitudinally and outwardly extending installing seat walls, with an installing hole formed thereby, wherein each installing seat wall has at least a thick portion and a thin portion and pivotal holes formed on lower portions of thin portions so that the pivotal portions of the latch structure may be inserted into the pivotal holes, wherein the thick portion is on an upper section of the seat wall and the thin portion is on a lower section of the seat wall thus forming an inclined surface.

6. The electrical connector as recited in claim 1, further comprising a stopping block transversely and inwardly extending from a top portion of the housing adjacent to the installing seat, the stopping block being located so as to contact the ejecting arm when the latch structure has rotated to the releasing position.

7. The electrical connector as recited in claim 1, wherein each of the plurality of terminals comprises:

a contact portion having a curved shape;

a U-shaped first elastic portion integrally extending upwardly from the contact portion and then extending downwardly;

a second elastic portion integrally extending downwardly from the first elastic portion at an angle thereto;

a stopping portion integrally and downwardly extending from a distal end of the second elastic portion, a width of the stopping portion being larger than a width of the terminal hole in the housing; and, a welding leg integrally extending downwardly from a distal end of the stopping portion;

whereby, when each terminal is inserted in one of the terminal holes, a front edge of the first elastic portion thereof bears against a stopping block on the housing, and a pre-stress is provided by elastic forces of the first elastic portion and the second elastic portion, while a free end of the contact portion does not bear against any wall within the terminal hole.

8. The electrical connector as recited in claim 7, wherein the stopping portion of the terminal, further comprises four tip portions formed on a surface facing an inner wall of the housing, the four tip portions being uniformly distributed on the surface.

9. The electrical connector as recited in claim 7, wherein the terminals comprise: a plurality of first terminals having the welding leg extending downwardly and vertically from the distal end of the stopping portion, and a concave portion is formed on the distal end of the stopping portion; and a plurality of second terminals having the welding leg extending generally horizontally from the distal end of the stopping portion, extending and then vertically downwardly.

10. An electrical connector for receiving a circuit board comprising:

an elongated insulative housing having a central groove extending in a longitudinal direction for receiving an edge of the circuit board a pair of installing seats provided at two opposite ends of the housing, each installing seat having a pair of transversely and inwardly extending stopping blocks and two longitudinally and outwardly extended installing seat walls, with installing holes formed thereby, wherein each installing seat wall has at least a thick wall portion a thin wall portion, and a stepping portion formed between the thin wall portion and the thick wall portion;

a plurality of conducting terminals arranged within a plurality of terminal holes on two transversely opposite side walls of the housing, when the edge of the circuit board is inserted into the central groove, the terminal within the terminal hole will electrically connect with a circuit track of the edge of the circuit board device; and a latch structure installed with each of the installing seats of the insulative housing, whereby each latch structure can inwardly and outwardly rotate between a position for fixedly locking the circuit board and a position for releasing the circuit board, each latch structure including a head section a pivotal arm integrally extending downwards from the head section a pivotal portion extending in an axial direction normal to the longitudinal direction and located under the pivotal arm and an ejecting arm extending inwardly in the longitudinal direction from a distal end of the pivotal arm, wherein an actuator section of the head section is formed by gradually and inwardly tapered surfaces on two transversely opposite sides of the head section, and each surface formed an inclined angle with respect to the longitudinal direction, wherein a force regulating device is provided on two transversely opposite side walls of the pivotal arm, the force regulating device comprising at least two flanges on opposite side walls of the pivotal arm, the at least two flanges on each of the side walls located in different elevation levels above the pivotal portion so that when the latch structure moves from the fixedly locking position to the releasing position, movement of the at least two flanges will be resisted by the stepping portion.

11. The electrical connector as recited in claim 10, wherein the pivotal arm of the latch structure has an enhanced rib extending from a wall facing the central groove, the enhanced rib extending substantially between the pivotal axial portion and an upper surface of the ejecting arm.

12. The electrical connector as recited in claim 10, further comprising a pivotal hole formed on a lower portion of the thin wall portion so that the pivotal portion of the latch structure may be inserted into the pivotal holes, wherein the thick wall portion is on an upper section of the seat wall and the thin portion is on a lower section of the seat wall thus forming an inclined surface.

13. The electrical connector as recited in claim 10, further comprising a stopping block transversely and inwardly extending from a top portion of the housing adjacent to the installing seat, the stopping block being located so as to contact the ejecting arm when the latch structure has rotated to the releasing position.

14. A latch structure for use in an electrical connector for receiving an edge of a circuit board, the electrical connector having an elongated insulative housing, a plurality of conducting terminals arranged within the housing, a central groove extending in a longitudinal direction for receiving the edge of the circuit board, the latch structure comprising a pair of installing seats provided at two opposite ends of the housing, each installing seat formed by at least two walls with different widths, at least one stepping portion formed between the different widths of the walls, each installing seat having an installing hole defined thereby, a head section having a top surface and two opposite side surfaces, wherein the top surface has a locking portion which engages an edge of the circuit board, and the two opposite side surfaces are provided with an actuation section by which, the latch structure can be longitudinally and outwardly pulled so as to rotate about an axial direction normal to the longitudinal direction from a fixedly locked position to a releasing position, the actuation section of the head section is formed by gradually and inwardly tapered surfaces on two transversely opposite sides of the head section, and each surface forms an inclined angle with respect to the longitudinal direction:

a pivotal arm integrally extending downwardly from the head section, the pivotal arm having a force regulating device on two transversely opposite side walls of the pivotal arm, the force regulating device comprising at least two flanges on the opposite side walls of the pivotal arm, the at least two flanges on each of the side walls located in different elevation levels above the pivotal portion so that when the latch structure moves from the fixedly locking position to the releasing position, movement of the at least two flanges will be resisted by the stepping portion with the installing hole;

a pivotal portion extending in an axial direction normal to the longitudinal direction and located below the pivotal arm; and, an ejecting arm integrally extending inwardly in the longitudinal direction from a distal end of the pivotal arm.

15. The latch structure as recited in claim 14, wherein the gradually and inwardly tapered surfaces on the two transversely opposite sides of the head section have alternatively arranged ridge portions and valley portions.

16. The latch structure as recited in claim 14, wherein the pivotal arm has an enhanced rib extending from a wall facing the central groove, the enhanced rib extending substantially between the pivotal portion and an upper surface of the ejecting arm.

17. The latch structure as recited in claim 14, further comprising an inclined surface formed on a lower edge of the pivotal portion.

* * * * *